US012537169B2

(12) United States Patent
Yamazaki

(10) Patent No.: US 12,537,169 B2
(45) Date of Patent: Jan. 27, 2026

(54) PLASMA SOURCE AND PLASMA PROCESSING APPARATUS

(71) Applicant: TOKYO ELECTRON LIMITED, Tokyo (JP)

(72) Inventor: Ryoji Yamazaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 521 days.

(21) Appl. No.: 17/979,291

(22) Filed: Nov. 2, 2022

(65) Prior Publication Data

US 2023/0141688 A1 May 11, 2023

(30) Foreign Application Priority Data

Nov. 10, 2021 (JP) ................................ 2021-183650

(51) Int. Cl.
*H01J 37/32* (2006.01)
*B23K 1/00* (2006.01)

(52) U.S. Cl.
CPC .. *H01J 37/32449* (2013.01); *H01J 37/32357* (2013.01); *B23K 1/0008* (2013.01); *H01J 37/321* (2013.01)

(58) Field of Classification Search
CPC ....... B23K 1/0008; B23K 1/19; H01J 37/321; H01J 37/32357; H01J 37/3244; H01J 37/32449; H01J 37/32458; H01J 37/32467; H01J 37/32513; H01J 2237/327
See application file for complete search history.

(56) References Cited

U.S. PATENT DOCUMENTS 6,302,402 B1 * 10/2001 Rynders .................. F28F 21/04 277/653
6,328,847 B1 * 12/2001 Winters ............ H01J 37/32458 118/733
2006/0226119 A1 * 10/2006 Kannan .................... C23G 5/00 257/E21.252
2007/0079935 A1 * 4/2007 Schuss .............. H01J 37/32522 156/345.37
2007/0245962 A1 * 10/2007 Choi ................. H01J 37/32174 118/723 I
2015/0303031 A1 * 10/2015 Choi ................. H01J 37/32467 315/111.51

FOREIGN PATENT DOCUMENTS

JP S63-138737 A 6/1988
JP 2002-217186 A 8/2002
JP 2004-179426 A 6/2004
JP 2005-302680 A 10/2005
JP 2006-040734 A 2/2006
KR 10-2001-0066896 A 7/2001

* cited by examiner

*Primary Examiner* — Benjamin Kendall
(74) *Attorney, Agent, or Firm* — Fenwick & West LLP

(57) ABSTRACT

A plasma source comprises a metal member having an inlet and forming a wall that delimits an upstream flow of a processing gas supplied from the inlet, a ceramic member having an outlet and forming a wall that delimits a downstream flow of the processing gas discharged from the outlet, and a power supply device configured to supply a power for plasma generation into a chamber. The chamber includes the metal member and the ceramic member, and is configured to discharge an activated gas generated by producing plasma from the processing gas to the outside of the chamber through the outlet.

12 Claims, 5 Drawing Sheets

PLASMA SOURCE AND PLASMA PROCESSING APPARATUS

CROSS-REFERENCE TO RELATED APPLICATIONS

This application claims priority to Japanese Patent Application No. 2021-183650 filed on Nov. 10, 2021, the entire contents of which are incorporated herein by reference.

TECHNICAL FIELD

The present disclosure relates to a plasma source and a plasma processing apparatus.

BACKGROUND

There is a plasma processing method for supplying reactive species of a gas from a remote plasma source to a reactor and performing wafer processing or cleaning in the reactor. For example, Japanese Patent Application Publication No. 2004-179426 discloses a method for performing cleaning in a reactor of a substrate processing apparatus by supplying reactive species of a fluorine-containing gas to the reactor from a remote plasma source installed in the substrate processing apparatus. The inner wall of the remote plasma source from which the reactive species of the fluorine-containing gas are supplied to the reactor is coated with fluororesin to reduce damage to the inner wall caused by the fluorine-containing gas and suppress generation of particles.

SUMMARY

The present disclosure provides a technology capable of effectively suppressing generation of particles.

One aspect of the present disclosure provides a plasma source comprising a metal member having an inlet and forming a wall that delimits an upstream flow of a processing gas supplied from the inlet, a ceramic member having an outlet and forming a wall that delimits a downstream flow of the processing gas discharged from the outlet, and a power supply device configured to supply a power for plasma generation into a chamber, wherein the chamber includes the metal member and the ceramic member, and is configured to discharge an activated gas generated by producing plasma from the processing gas to the outside of the chamber through the outlet.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
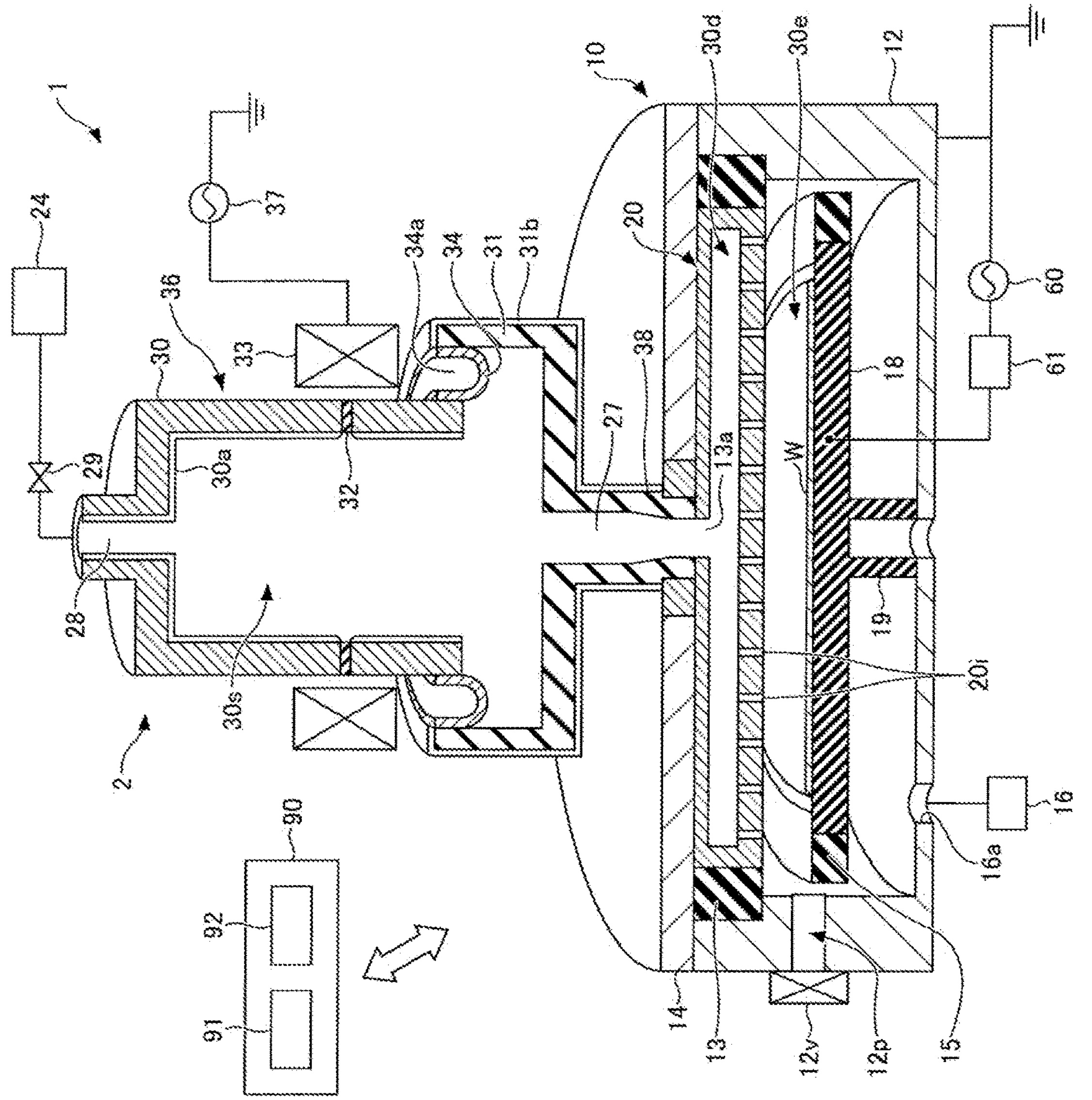
FIG. 1 shows a configuration example 1 of a plasma source and a configuration example of a plasma processing apparatus according to an embodiment.

Hereinafter, embodiments of the present disclosure will be described with reference to the accompanying drawings. Like reference numerals will be given to like parts throughout the drawings, and redundant description thereof may be omitted.

For example, there is a plasma processing method for processing a substrate that is a wafer using a processing gas or cleaning a reactor by supplying reactive species (activated gas) of a fluorine-containing gas such as $NF_3$ gas or the like from a remote plasma source (hereinafter, also referred to as "plasma source") to the reactor. In this plasma processing method, fluorination progresses due to heat generated at a location where the fluorine-containing gas stagnates, such as a bent portion of a line of the plasma source, a line or an inner wall near an outlet for the activated gas, or the like. In a conventional plasma source, aluminum, for example, forming a chamber wall may be fluorinated to aluminum fluoride (AlF), and AlF may be peeled off from the wall and become particles.

In the case of forming an oxide film such as yttria ($Y_2O_3$) or forming alumina ($Al_2O_3$) by performing surface treatment such as alumite treatment (anodic oxidation treatment) or the like on the inner wall of the chamber, it is possible to reduce particles by suppressing fluorination of the chamber wall. However, the oxide film is also peeled off or cracked due to damage, and the fluorine-containing gas reaches aluminum forming the chamber wall. Accordingly, AlF or strips generated from the inner wall of the chamber may become particles and fall into the reactor.

Therefore, in the plasma source of the present embodiment, instead of performing conventional surface treatment to form an oxide film such as yttria or alumina, the location in the chamber that is likely to be fluorinated, e.g., the vicinity of the outlet for the reactive species (activated gas), is formed of an yttria sintered body. In other words, a chamber wall on a downstream side of a gas is likely to be fluorinated due to an increase in a residence time of a gas supplied into the chamber from an inlet for supplying a gas to a plasma source or an increase in a density of the gas, and thus, the chamber wall on the downstream side of the gas is formed of an yttria sintered body. Thus, the durability of the chamber wall is improved. Accordingly, fluorine components do not enter the inner wall of the chamber where fluorination is likely to occur, thereby suppressing the generation of particles from the chamber wall or the like due to damage and preventing particles from falling from the plasma source into the reactor. Hereinafter, a configuration example 1 of a plasma source and a plasma processing apparatus according to an embodiment will be described in detail with reference to FIG. 1.

Configuration Example 1 of Plasma Source and Plasma Processing Apparatus

FIG. 1 shows a configuration example 1 of a plasma source 2 and a configuration example of a plasma processing apparatus 1 including the plasma source 2 according to an embodiment. The plasma source 2 has a chamber 36 and a power supply 37. The chamber 36 has a metal member 30 and a ceramic member 31. In FIG. 1, the size relationship between the plasma source 2 and a reactor 10 is ignored.

(Chamber Structure)

The metal member 30 is made of a metal such as aluminum or the like, and has a substantially cylindrical shape. The inner space of the metal member 30 serves as a plasma generation space 30*s*. The upper portion of the metal member 30 is closed and the lower portion thereof is opened. An inlet 28 for a processing gas is formed substantially at the center of the upper portion of the metal member 30. The inlet 28 is connected to a gas supply device 24 through an opening/closing valve 29. The metal member 30 constitutes a wall that delimits the upstream flow of the processing gas supplied from the inlet 28. The processing gas is supplied from the gas supply device 24. The supply and the stop of the supply of the processing gas are controlled by the opening/closing valve 29, and the processing gas is introduced into the metal member 30 from the inlet 28. The processing gas includes a cleaning gases, a film forming gas, an etching gas, or the like.

The power supply device 37 supplies a power for plasma generation into the chamber 36. The power for plasma generation may be a radio frequency (RF) power having a frequency of 400 kHz, 13.56 MHz, or the like. The power supply device 37 is connected to a coil 33 wound around the metal member 30 and applies an RF power to the coil 33. On the sidewall of the metal member 30, a gap is formed in a circumferential direction at a height where the coil 33 is disposed, and an annular dielectric window 32 is fitted in the gap. An electromagnetic field generated by applying an RF power to the coil 33 passes through the dielectric window 32 and propagates to the plasma generation space 30*s* in the metal member 30, thereby contributing to production of plasma from a gas.

Accordingly, plasma of the processing gas is produced in the plasma generation space 30*s*. The inner wall of the metal member 30 is coated with an yttria sprayed film 30*a*. Plasma electrolytic oxidation (PEO) may be performed on the wall of the metal member 30. In any case, the plasma resistance can be improved.

The chamber 36 of the plasma source 2 of the present embodiment mainly includes two members, i.e., the metal member 30 that delimits the upstream flow of the processing gas and the ceramic member 31 that delimits the downstream flow thereof. In other words, the ceramic member 31 has an outlet 27 and constitutes a wall that delimits the downstream flow of the processing gas (activated gas) discharged from the outlet 27. In the plasma source 2 of the present embodiment, the ceramic member 31 is formed of an yttria sintered body.

Figure 2:
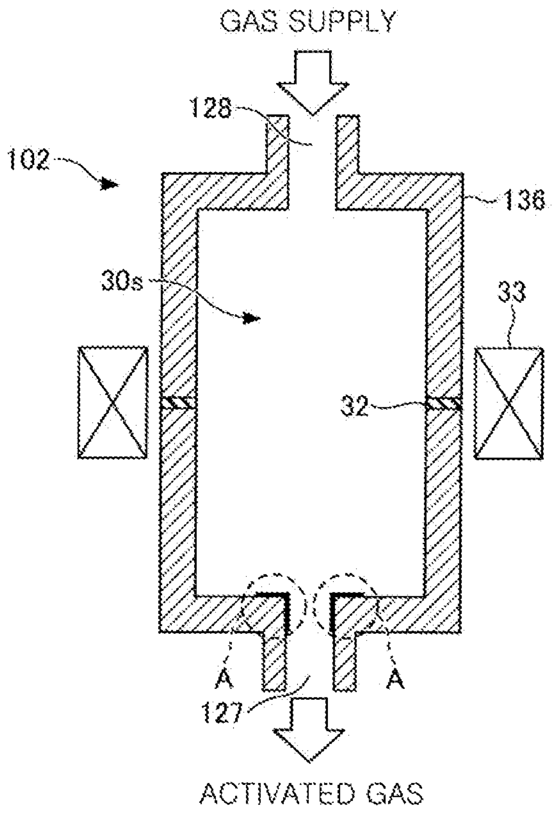
FIG.2 (Related Art)
FIG. 2 shows a configuration example "a" of a conventional plasma source.

A configuration example "a" of a conventional plasma source 102 is shown in FIG. 2. In the configuration example "a" of the conventional plasma source 102, the processing gas is introduced from an inlet 128 formed at an upper portion of a chamber 136 made of aluminum, and plasma is produced in the plasma generation space 30*s*. In the vicinity of the outlet 127 (e.g., area A) on the downstream side of the gas that is likely to fluorinate due to an increase in the residence time of the gas or an increase in the density of the gas, fluorine components enter the chamber wall made of aluminum, thereby generating particles. Similarly, when a ceramic coating is thermally sprayed on the inner wall surface of the chamber 136, the fluorine components enter the ceramic coating in the area A, for example, thereby generating particles.

Therefore, in configuration example 1 of the plasma source 2 of the present embodiment shown in FIG. 1, the wall that delimits the downstream flow of the processing gas near the outlet 27 is formed of an yttria sintered body. In other words, the chamber 36 of the present disclosure mainly includes the ceramic member 31 formed of an yttria sintered body and the metal member 30 made of aluminum.

Accordingly, the durability against fluorine is improved by providing an yttria sintered body only at the outlet 27 where the residence time of the gas increases or the density of the gas becomes high and the vicinity of the outlet 27 on the downstream side of the processing gas. In other words, since the sintered body having a dense structure compared to ceramic formed by thermal spraying is used for the ceramic member 31, the durability against fluorine is further improved. However, yttria has low thermal conductivity, so that it is preferable to provide the ceramic member 31 formed of an yttria sintered body only at the portion where the gas stagnates in the chamber 36. The metal member 30 made of aluminum defines the supply port 28 and its vicinity on the upstream side of the processing gas and the portion between the upstream side and the downstream side.

With this configuration, the chamber 36 includes the metal member 30 and the ceramic member 31, and is configured to discharge the activated gas generated by producing plasma to the outside of the chamber 36 through the outlet 27. Accordingly, it is possible to suppress the generation of particles due to the fluorination of the chamber wall on the downstream side of the gas. In addition, the chamber 36 can be easily cooled due to high thermal conductivity of the metal member 30.

Since yttria has plasma resistance, it is preferable that the yttria sintered body is exposed on the inner wall of the ceramic member 31. On the other hand, it is necessary to form a metal deposition film 31*b* on the outer wall of the ceramic member 31. Since the ceramic member 31 is a dielectric material, the electromagnetic waves propagating in the plasma generation space 30*s* reach the atmosphere outside the chamber 36 if there is no deposition film 31*b*. Hence, a metal such as aluminum, chromium, nickel, tantalum, or the like is deposited on the outer wall of the ceramic member 31. The leakage of electromagnetic waves can be prevented by the deposition film 31*b*.

The ceramic member 31 may be formed of an alumina ($Al_2O_3$) sintered body, an yttrium fluoride (YF3) sintered body, a magnesium fluoride (MgF) sintered body, or a calcium fluoride (CaF) sintered body, instead of an yttria sintered body. Since, however, an alumina sintered body, a magnesium fluoride sintered body, and a calcium fluoride sintered body have lower resistance to fluorine plasma compared to the yttria sintered body, it is preferable to use an yttria sintered body for the ceramic member 31.

The metal member 30 is not necessarily made of aluminum, and may be made of any material which can form a surface resistant to fluoride plasma processing.

The entire chamber 36 may be formed of an yttria sintered body. In this case, the deposition film 31*b* is formed on the entire outer wall of the ceramic member 31 except the dielectric window 32. However, when the entire chamber 36 is made of ceramic such as an yttria sintered body or the like, the manufacturing cost of the plasma source 2 increases and, also, the cooling efficiency decreases in terms of thermal conductivity. Hence, it is preferable to limit the location where the ceramic member 31 is used.

In the chamber 36, the fluorine components are likely to enter the location where the density of the fluorine-containing gas increases or the flow velocity of the fluorine-containing gas decreases, such as the location where the gas channel is narrowed or the gas stagnates. Therefore, it is preferable to provide the ceramic member 31 at least at the location where the fluorine components are likely to reach.

(Stress Buffer)

The metal member 30 and the ceramic member 31 are brazed to each other with a stress buffer 34 interposed therebetween. When the metal member 30 and the ceramic member 31 are directly bonded, cracks or the like may be generated in the joining portion between the metal member 30 and the ceramic member 31 or at the ceramic member 31 due to the temperature difference in the chamber 36 caused by thermal expansion. When cracks or the like are generated, the fluorine components enter the cracks, and particles are generated due to corrosion of the joining portion. Therefore, the metal member 30 and the ceramic member 31 are not directly bonded, and the annular stress buffer 34 is interposed between the metal member 30 and the ceramic member 31. The stress buffer 34 is brazed in a circumferential direction to the outer wall near the lower end of the metal member 30 and the inner wall near the upper end of the ceramic member 31. The brazing may be active metal brazing in which titanium and silver are mixed, for example. Further, metallization may be used for bonding the stress buffer 34 and the ceramic member 31 formed of an yttria sintered body.

The stress buffer 34 is preferably made of a material having a thermal expansion coefficient between the thermal expansion coefficient of the metal member 30 and the thermal expansion coefficient of the ceramic member 31. For example, the stress buffer 34 is preferably made of a nickel-based metal having a composition of 29% Ni, 17% Co, and the balance F. Kovar (Registered Trademark) may be used as an example of such a metal. The stress buffer 34 can absorb stress caused by the thermal expansion difference between the metal member 30 and the ceramic member 31, which makes it possible to prevent cracks from being generated at the metal member 30 or the ceramic member 31. However, the stress buffer 34 may have a linear thermal expansion coefficient greater than or equal to that of the ceramic member 31 and smaller than or equal to that of the metal member 30.

In the example of FIG. 1, the stress buffer 34 is a hollow spring-like member having an opening 34*a* with a U-shaped cross section. The opening 34*a* is opened in the same direction as the direction in which one of the inlet 28 and the outlet 27 is opened.

Figure 3:
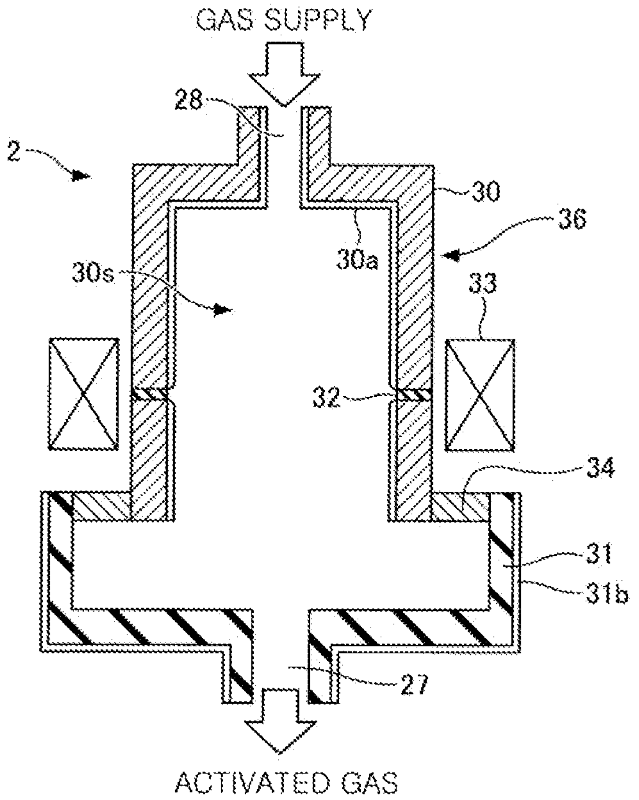
FIG. 3 shows a modification of a stress buffer according to an embodiment.

The structure of the stress buffer 34 shown in FIG. 1 is an example, and the stress buffer 34 may be a plate-shaped member that is a modification of the stress buffer 34 shown in FIG. 3 as long as a load is not applied to the ceramic member 31 and the joining portion between the metal member 30 and the ceramic member 31.

(Plasma Processing Apparatus)

Referring back to FIG. 1, the plasma processing apparatus 1 includes the plasma source 2 and the reactor 10. A connecting portion 38 has the outlet 27 of the plasma source 2 therein and is fitted into the opening/hole formed in/at the upper wall of the reactor 10. Accordingly, the plasma source 2 is installed. In the plasma source 2, plasma is produced from the processing gas, and the generated activated gas is discharged to the outside of the chamber 36 through the outlet 27 and supplied into the reactor 10. At this time, the ceramic member 31 formed of an yttria sintered body is used to improve the corrosion resistance of the outlet 27 and its vicinity where the gas conductance increases and the residence time increases. Thus, even when a fluorine-containing gas is used for cleaning, for example, the fluorine-containing gas does not enter the yttria sintered body, thereby suppressing the generation of particles and preventing particles from falling into the reactor 10. Although not shown, it is preferable to provide a valve in the connecting portion 38 to prevent backflow of a gas and to reduce the volume of the reactor 10.

The reactor 10 includes a chamber body 12. The chamber body 12 has a substantially cylindrical shape and defines a sidewall and a bottom wall of the reactor 10. The chamber body 12 has an upper opening. The chamber body 12 is made of a metal such as aluminum or the like, and is grounded.

The sidewall of the chamber body 12 has a passage 12*p*. The substrate W is transferred between the inside of the reactor and the outside of the reactor 10 through the passage 12*p*. The passage 12*p* can be opened and closed by a gate valve 12*v*. A gate valve 12*v* is disposed along the sidewall of the chamber body 12.

The reactor 10 further includes an upper wall 14 made of a metal such as aluminum or the like. The upper wall 14 has a substantially disc shape, and closes the upper opening of the chamber body 12. The upper wall 14 is grounded.

The bottom wall of reactor 10 has an exhaust port 16*a*. The exhaust port 16*a* is connected to an exhaust device 16. The exhaust device 16 includes a pressure controller such as an automatic pressure control valve, and a vacuum pump such as a turbo molecular pump.

The plasma processing apparatus 1 further includes a substrate support 18. The substrate support 18 is disposed in the reactor 10. The substrate support 18 is configured to support the substrate W placed thereon. The substrate W is placed on the substrate support 18 in a substantially horizontal state. The substrate support 18 may be supported by a support member 19. The support member 19 extends upward from the bottom portion of the reactor 10. The substrate support 18 and the support member 19 may be made of a dielectric such as aluminum nitride or the like.

The plasma processing apparatus 1 further includes a shower head 20. The shower head 20 is made of a metal such as aluminum or the like. The shower head 20 has a substantially disc shape and has a diffusion space 30*d* therein. The shower head 20 is disposed above the substrate support 18 and below the upper wall 14. The shower head 20 constitutes a ceiling that defines the inner space of the reactor 10, and the upper wall 14 is disposed on the shower head 20.

A plurality of gas holes 20*i* are formed through the diffusion space 30*d* in a vertical direction. The gas holes 20*i* are opened on the bottom surface of the shower head 20 to introduce a gas toward a processing space 30*e* between the shower head 20 in the reactor 10 and the substrate support 18. Accordingly, the shower head 20 introduces the activated gas supplied from the plasma source 2 from the diffusion space 30*d* into the processing space 30*e* through the holes 20*i*.

The outer circumference of the shower head 20 is covered with a dielectric member 13 such as ceramic. The outer circumference of the substrate support 18 is covered with a dielectric member 15 such as ceramic. When the RF power is not applied to the shower head 20, the dielectric member 13 may be omitted. However, it is preferable to provide the dielectric member 13 in order to determine the area of the shower head 20 that functions as the counter electrode of the substrate support 18. Further, it is preferable to provide the dielectric member 13 in order to make the ratio between the anode and the cathode of the electrode approximately equal.

An RF power supply 60 is connected to the substrate support 18 via a matching device 61. The matching device 61 has an impedance matching circuit. The impedance matching circuit is configured to match an output impedance of the RF power supply 60 and a load impedance on a plasma side. The RF power supplied from the RF power supply 60 has a frequency of 60 MHz or less. The RF power may have a high frequency of 13.56 MHz, for example. The RF power may be applied to the shower head 20 by the RF power supply 60.

In the plasma processing apparatus 1 configured as described above, the reactor 10 communicates with the chamber 36 and the activated gas is introduced from the outlet 27. The activated gas is supplied to the processing space 30*e* through an inlet 13*a* of the shower head 20 and the diffusion space 30*d*. The activated gas that has reached the processing space 30*e* is easily re-dissociated by the RF power from the RF power supply 60, so that the substrate W can be processed using the activated gas. Alternatively, the activated gas may be directly supplied to the processing space 30*e* without providing the RF power supply 60.

A controller (control device) 90 may be a computer having a processor 91 and a memory 92. The controller 90 includes a calculation device, a storage device, an input device, a display device, a signal input/output interface, and the like. The controller 90 controls individual components of the plasma processing apparatus 1 including the plasma source 2. In the controller 90, an operator may use the input device to input commands to manage the plasma processing apparatus 1. In addition, the controller 90 can visualize and display the operation status of the plasma processing apparatus 1 using the display device. The memory 92 of the controller 90 stores a control program and recipe data. The control program is executed by the processor 91 of the controller 90 to perform various processes in the plasma processing apparatus 1. The processor 91 executes the control program and controls individual components of the plasma processing apparatus 1 based on the recipe data. Accordingly, the plasma processing apparatus 1 can perform cleaning, film formation, etching, and other various plasma processing using a fluorine-containing gas such as $NF_3$ gas, $ClF_3$ gas, or the like.

Other Configuration Examples of Plasma Source

Figure 4A:
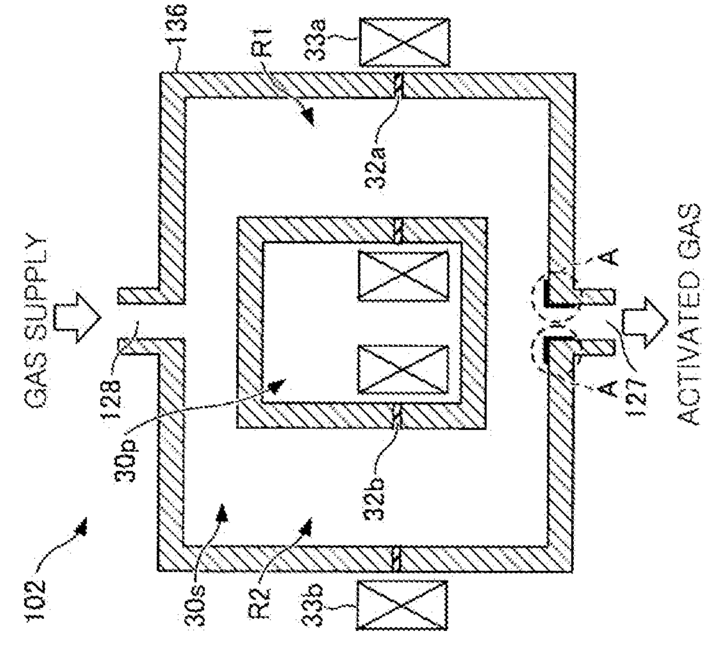
FIG. 4A (Related Art)
FIG. 4A shows a configuration example "b" of the conventional plasma source.
Figure 4B:
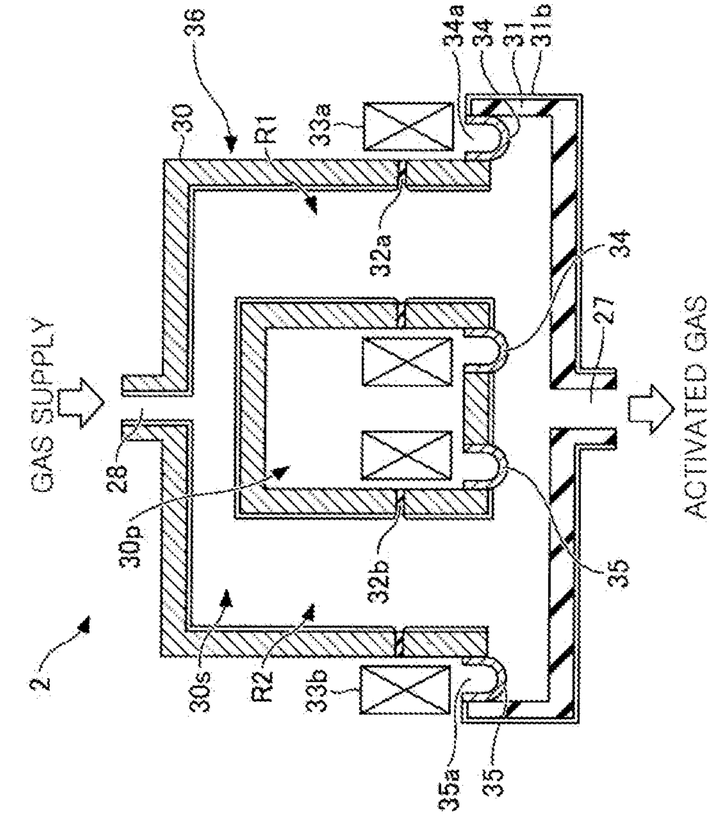
FIG. 4B shows a configuration example 2 of the plasma source according to the embodiment.
Figure 5:
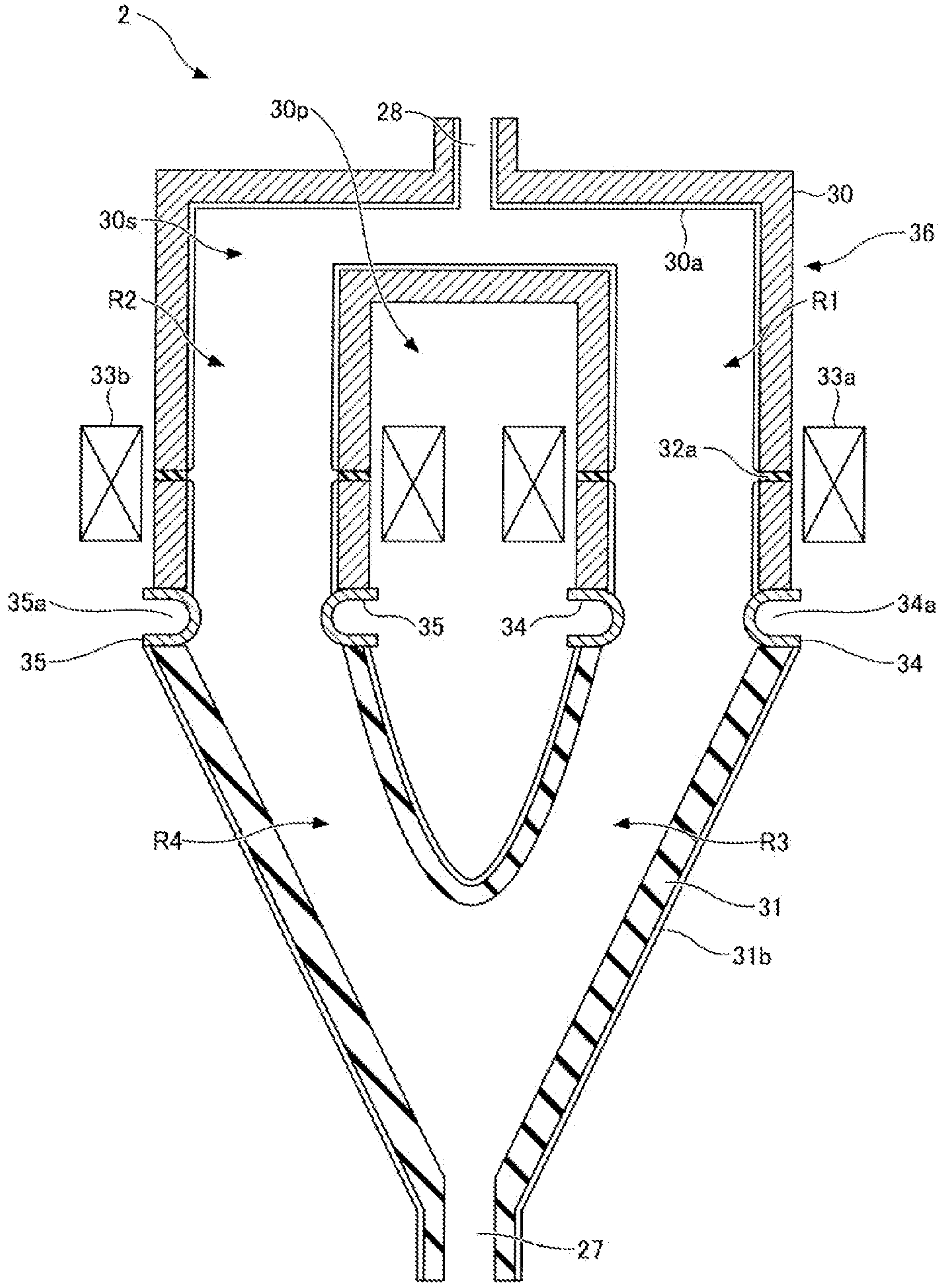
FIG. 5 shows a configuration example 3 of the plasma source according to the embodiment.

Other configuration examples of the plasma source 2 will be described with reference to FIGS. 4A, 4B, and 5. FIG. 4A shows a configuration example "b" of the conventional plasma source 102, and FIG. 4B shows a configuration example 2 of the plasma source 2 according to the embodiment. FIG. 5 shows a configuration example 3 of the plasma source 2 according to the embodiment.

In configuration example "b" of the conventional plasma source 102 of FIG. 4A, the processing gas is introduced from the inlet 128 formed in the upper wall of the chamber 136 made of aluminum. The chamber 136 is configured such that a plurality of plasma generation channels R1 and R2 branched from the inlet 128 are formed. The plasma generation channels R1 and R2 are branched from the upstream side of the gas flow, and gases flow through an annular gas channel or two or more branched gas channels and join at the downstream side.

In configuration example "b" of the conventional plasma source 102, the chamber 136 has an atmospheric space 30*p* in the plasma generation space 30*s*. An RF power is applied to a plurality of coils 33*a* and 33*b* wound around the chamber 136. The RF power applied to the coils 33*a* and 33*b* passes through dielectric windows 32*a* and 32*b* and is supplied to the plasma generation space 30*s* in the chamber 136 to produce plasma from the processing gas.

In the vicinity of the exhaust port 127 (e.g., area A) on the downstream side of the gas supplied from the inlet 128, where the gas is likely to fluorinate due to an increase in the residence time of the gas or an increase in the density of the gas, fluorine components enter the wall of the chamber 136 made of aluminum, thereby generating particles.

Therefore, in configuration example 2 of the plasma source 2 of the present embodiment shown in FIG. 4B, the chamber 36 includes the ceramic member 31 formed of an yttria sintered body and the metal member 30 made of aluminum. Further, the ceramic member 31 that defines the downstream side of the processing gas supplied from the inlet 28 and discharged from the outlet 27 is formed of an yttria sintered body. Accordingly, the fluorine components do not enter the dense yttria sintered body, thereby suppressing the generation of particles.

The chamber 36 has the atmospheric space 30*p* in the plasma generation space 30*s*. The ceramic member 31 is configured to form at least the joining portion of the plasma generating channels R1 and R2. The stress buffers 34 and 35 are disposed between the plasma generation channels R1 and R2 and the ceramic member 31, respectively. The stress buffers 34 and 35 are brazed to the outer wall of the metal member 30 and the inner wall of the ceramic member 31 in the plasma generation channels R1 and R2, respectively.

In the configuration example 3 of the plasma source 2 of the present embodiment shown in FIG. 5, the chamber 36 of the present disclosure includes the metal member 30 made of aluminum and the ceramic member 31 formed of an yttria sintered body. The structure of the metal member 30 is the same as that in the configuration example 2 of the plasma source 2 of FIG. 4B. Further, similarly to the configuration example 2, the ceramic member 31 that delimits the downstream flow of the processing gas discharged from the outlet 27 is formed of an yttria sintered body. Accordingly, the generation of particles can be suppressed.

The plasma generation space 30*s* has therein the atmospheric space 30*p*, and the ceramic member 31 is configured to form at least the joining portion of the plasma generation channels R1 and R2. The stress buffers 34 and 35 are disposed between the plasma generation channels R1 and R2 and the ceramic member 31, respectively. The stress buffers 34 and 35 are brazed to the metal member 30 and the ceramic member 31 in the plasma generation channels R1 and R2.

The configuration example 3 is different from the configuration example 2 of the plasma source 2 shown in FIG. 4B in that a plurality of plasma generation channels R3 and R4 of the ceramic member 31 are obliquely formed such that the ceramic member 31 has a Y-shaped vertical cross section and communicate with the plasma generation channels R1 and R2, respectively. Since the plasma generation channels R3 and R4 are formed obliquely, stepped portions or corner portions in the channels are reduced and the gas flow is improved, which makes the occurrence of turbulence or convection near the outlet 27 difficult. Accordingly, the deterioration of the ceramic member 31 due to fluorine components can be further suppressed, thereby further suppressing the generation of particles.

In addition, the configuration example 3 is different from the configuration example 2 of the plasma source 2 of FIG. 4B in that the stress buffers 34 and 35 are brazed to the lower end of the metal member 30 and the upper end of the ceramic member 31. In this case, openings 34*a* and 35*a* of the respective stress buffers 34 and 35 are opened in a direction perpendicular to the direction in which the inlet 28 and the outlet 27 are opened. However, the present disclosure is not limited thereto, and the openings 34*a* and 35*a* of the respective stress buffers 34 and 35 may be opened obliquely with respect to the direction in which the inlet 28 and the outlet 27 are opened.

As described above, in accordance with the plasma source 2 and the plasma processing apparatus 1 of the present embodiment, the corrosion resistance is improved by providing the ceramic member 31 formed of an yttria sintered body at the location where the residence time increases due to a high conductance on the downstream side of the gas flow, thereby effectively suppressing the generation of particles.

The plasma source and the plasma processing apparatus according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma source comprising:

a chamber including a metal member and a ceramic member;

a coil wound around the metal member; and a power supply device configured to supply a power to the coil for plasma generation into the chamber, wherein the metal member of the chamber has an inlet and forms a wall that delimits an upstream flow of a processing gas supplied from the inlet;

the ceramic member of the chamber has an outlet and forms a wall that delimits a downstream flow of the processing gas discharged from the outlet;

a gap is formed on a sidewall of the metal member at a height where the coil is disposed, and a dielectric window is fitted in the gap;

an electromagnetic field generated by applying an RF power to the coil passes through the dielectric window and propagates to a plasma generation space in the metal member, thereby contributing to production of plasma from the processing gas;

a portion of the sidewall of the ceramic member and a portion of the sidewall of the metal member overlap with each other, and the ceramic member of the chamber is wider than the metal member of the chamber at an overlap portion; and the chamber is configured to discharge an activated gas generated by producing plasma from the processing gas to the outside of the chamber through the outlet.

2. The plasma source of claim 1, wherein the ceramic member is a sintered body.

3. The plasma source of claim 1, wherein the metal member and the ceramic member are brazed to each other with a stress buffer interposed therebetween.

4. The plasma source of claim 3, wherein the stress buffer is brazed to an outer wall of the metal member and an inner wall of the ceramic member.

5. The plasma source of claim 3, wherein the stress buffer is brazed to a lower end of the metal member and an upper end of the ceramic member.

6. The plasma source of claim 3, wherein the stress buffer is a spring-like member.

7. The plasma source of claim 6, wherein the spring-like member is a hollow member having an opening, and the opening is opened in the same direction as the direction in which any one of the inlet and the outlet is opened.

8. The plasma source of claim 6, wherein the spring-like member is a hollow member having an opening, and the opening is opened in a direction different from the direction in which the inlet and the outlet are opened.

9. The plasma source of claim 3, wherein a linear thermal expansion coefficient of the stress buffer is greater than or equal to a linear thermal expansion coefficient of the ceramic member and smaller than or equal to a linear thermal expansion coefficient of the metal member.

10. The plasma source of claim 1, wherein a metal deposition film is formed on an outer wall of the ceramic member.

11. The plasma source of claim 1, wherein the metal member is configured to form an annular plasma generation channel or a plurality of plasma generation channels branched from the inlet, and the ceramic member is configured to form at least a joining portion of the annular plasma generation channel or the plurality of plasma generation channels.

12. A plasma processing apparatus comprising:

a plasma source having a chamber and configured to discharge an activated gas generated by producing plasma from a processing gas in the chamber to the outside of the chamber through an outlet; and a reactor communicating with the chamber and configured to introduce the activated gas and process a substrate using the activated gas;

wherein the plasma source includes:

the chamber including a metal member and a ceramic member;

a coil wound around the metal member; and a power supply device configured to supply a power to the coil for plasma generation into the chamber, wherein the metal member of the chamber has an inlet and forms a wall that delimits an upstream flow of a processing gas supplied from the inlet;

the ceramic member of the chamber has the outlet and forms a wall that delimits a downstream flow of the processing gas discharged from the outlet;

a gap is formed on a sidewall of the metal member at a height where the coil is disposed, and a dielectric window is fitted in the gap;

an electromagnetic field generated by applying an RF power to the coil passes through the dielectric window and propagates to a plasma generation space in the metal member, thereby contributing to production of plasma from the processing gas; and a portion of the sidewall of the ceramic member and a portion of the sidewall of the metal member overlap with each other, and the ceramic member of the chamber is wider than the metal member of the chamber at an overlap portion.

* * * * *